(12) United States Patent
Pagani

(10) Patent No.: US 8,604,816 B2
(45) Date of Patent: Dec. 10, 2013

(54) PROBE CARD FOR TESTING INTEGRATED CIRCUITS

(75) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 519 days.

(21) Appl. No.: 12/809,964

(22) PCT Filed: Dec. 19, 2008

(86) PCT No.: PCT/EP2008/068047
§ 371 (c)(1),
(2), (4) Date: Aug. 11, 2010

(87) PCT Pub. No.: WO2009/080760
PCT Pub. Date: Jul. 2, 2009

(65) Prior Publication Data
US 2010/0308855 A1    Dec. 9, 2010

(30) Foreign Application Priority Data
Dec. 20, 2007 (IT) .............................. MI2007A2399

(51) Int. Cl.
*G01R 31/00* (2006.01)
*G01R 31/20* (2006.01)

(52) U.S. Cl.
USPC ............. 324/756.03; 324/754.07; 324/755.01

(58) Field of Classification Search
None
See application file for complete search history.

(56) References Cited

U.S. PATENT DOCUMENTS

| | | | |
|---|---|---|---|
| 6,690,185 B1 | 2/2004 | Khandros et al. | |
| 2002/0053922 A1 | 5/2002 | Iino | |
| 2004/0163252 A1 | 8/2004 | Khandros et al. | |
| 2005/0275418 A1 | 12/2005 | Chong et al. | |
| 2007/0046304 A1 | 3/2007 | Mok et al. | |
| 2007/0085554 A1 | 4/2007 | Huang et al. | |
| 2010/0164526 A1* | 7/2010 | Pagani | 324/762 |
| 2012/0313659 A1* | 12/2012 | Hsu | 324/755.05 |

OTHER PUBLICATIONS

International Search Report based on International Application Serial No. PCT/EP2008/068047, European Patent Office, Mar. 27, 2009.
International Search Report based on International Application Serial No. PCT/US2006/026723, United States Patent Office, Jun. 21, 2007.

* cited by examiner

*Primary Examiner* — Jermele M Hollington
(74) *Attorney, Agent, or Firm* — Graybeal Jackson LLP

(57) ABSTRACT

An embodiment of a probe card adapted for testing at least one integrated circuit integrated on a corresponding at least one die of a semiconductor material wafer, the probe card including a board adapted for the coupling to a tester apparatus, and a plurality of probes coupled to the said board, wherein the probe card comprises a plurality of replaceable elementary units, each one comprising at least one of said probes for contacting externally-accessible terminals of an integrated circuit under test, the plurality of replaceable elementary units being arranged so as to correspond to an arrangement of at least one die on the semiconductor material wafer containing integrated circuits to be tested.

39 Claims, 8 Drawing Sheets

PROBE CARD FOR TESTING INTEGRATED CIRCUITS

PRIORITY CLAIM

The present application is a national phase application filed pursuant to 35 USC §371 of International Patent Application Serial No. PCT/EP2008/068047, filed Dec. 19, 2008; which further claims the benefit of Italian Patent Application MI2007A002399, filed Dec. 20, 2007; all of the foregoing applications are incorporated herein by reference in their entireties.

TECHNICAL FIELD

An embodiment of the present disclosure relates to systems for testing Integrated Circuits (ICs), and in particular it relates to probe cards for testing ICs.

BACKGROUND

ICs are typically manufactured many at a time in the form of dies on a semiconductor material wafer. After manufacturing, the semiconductor wafer is diced, so as to obtain a plurality of IC chips.

Before being packaged and shipped to the customers, and installed in various electronic systems, the ICs are tested for assessing their functionality, and in particular for ensuring that they are not defective. In particular, during the test, information regarding global or local physical faults (such as undesired presence of short circuits and break-down events) and more generally the operation of the IC on each die under test, may be detected (for example, by checking the waveform of one or more output signals generated by the IC on each die under test) so that only the dies that meet predetermined requirements proceed to the subsequent manufacturing phases (such as lead bonding, packaging and final testing).

According to a known testing technique, the IC dies are tested before the semiconductor wafer is diced into the individual chips. The test conducted at the wafer level is referred to as "wafer sort" or, as it is sometimes called, EWS (acronym for Electrical Wafer Sort)

For example, in the case of non-volatile semiconductor memory devices (such as Flash memories) the EWS is performed on each die wherein the memory device is formed, in order to verify the correct operation thereof.

For performing the test, a testing apparatus is used comprising a tester, which is coupled to the semiconductor wafer containing the dies to be tested, by means of a probe card, which is used for interfacing the semiconductor wafer to the tester.

The tester is adapted to manage signals that are employed for performing the test. Hereinafter, such signals will be referred as test signals and will be intended to include test stimuli (e.g., commands, addresses of memory locations, data to be written into the memory device) which are generated by the tester and are sent to each die to be tested by the probe card, and test response signals, which are generated by the ICs integrated in each die under test in response to the received test stimuli. The test response signals are sent by the IC integrated in each die under test to the tester, which processes them to derive an indication of the proper or improper operation of the ICs in the dies under test.

Probes are employed for the electrical coupling, through a physical contact, of the probe card with the dies to be tested, necessary for accomplishing the test signal exchange. For this purpose, the probe card consists of a PCB (Printed Circuit Board), which is connected to mechanical probes, which are adapted to physically contact input/output contact pads of each die to be tested.

In particular, each input/output contact pad consists of an enlarged metallization region surrounded and partially overlapped by a passivation layer.

During the testing, the metal contact pad is scrubbed by the mechanical scrubbing action of the probe tip. In such a way, the exchange of the test signals between the tester and the die to be tested may be accomplished.

Several probe card parameters contribute to improve the performance of the testing apparatus. Among the relevant probe card parameters, the planarity takes an important role. The planarity is the vertical distance (i.e., the distance along the Z-axis indicated in FIG. 1) between the highest and lowest probe tips of the probe card. The planarity affects the alignment between the probe tip and the contact pad so that, for example, a poor planarity may cause the scrub mark length and depth to be different from the desired scrub mark length and depth; this may modify the position in the plane defined by the X-axis and Y-axis in FIG. 1 as time passes. Another important parameter is the probe alignment accuracy, that is the position of the center of the scrub mark in the plane defined by the X-axis and Y-axis with respect to the center of the pad. In detail, scrub marks that are too long, or probe tips contacting the pad near the pad edge, may cause the passivation layer to be broken, while excessively deep scrub marks may damage the pad metallization region to the extent that the pads are then unusable for the testing and also for the normal operation of the IC. Damages to the input/output contact pads may also cause problems in the packaging phase of the die, since the input/output contact pads which are used for the testing are also used for bonding the die to the package.

The probe card parameters vary depending on the type of the probe cards.

Cantilever probe cards usually comprise a ring (for example made of aluminium, special alloys, or ceramic material) to which an epoxy holder is attached. Such epoxy holder is adapted to hold a plurality of testing elements in the form of resilient probes, made of an alloy having good electrical and mechanical properties. In particular, each cantilever probe includes a beam which is attached at only one of its ends to the epoxy holder, and at the other end the beam includes a tip which in use is intended to abut against a contact pad of the die with the IC to be tested.

A drawback of these probe cards is that some of their probe card parameters are unsatisfactory, so that, for example, alignment errors (such as an X-axis error, and/or an Y-axis error and/or a rotational error) between the probes' tips and the contact pads (that is, between wafer and probe card) may take place, with consequent potential problems of passivation layer breakage and with a negative impact on quality.

More specifically, the X-axis error and the Y-axis error represent the misalignment of the probes along the X and the Y directions, respectively, with the contact pads to be contacted. Due to the X-axis and Y-axis errors, the scrub mark on the contact pad may be off-center along the X direction and/or the Y direction.

In particular, during the testing of each die, rows of contact pads placed on opposite sides of the die are often contacted by the probes tips. In case of X-axis and Y-axis errors, all the probes may be misaligned in the same direction (X or Y), causing a displacement of the scrub marks along the X or the Y direction.

When the scrub marks of the contact pads on one side of the die are displaced towards the outer die edge, whereas the scrub marks of the contact pads on the other side of the die are displaced towards the inside of the die, a rotational error exists.

Such errors are emphasized by the fact that the cantilever probes are typically made based on mechanical techniques, so that the probes are different from each other. Such difference may further impair the values of the probe-card mechanical parameters.

In addition, this type of probe card may have some other limitations; for example, they may have a reduced parallel testing capacity: indeed, when several dies have to be tested at the same time, the number of mechanical probes significantly increases, and it may happen that the electrical contacts between the contact pads and the probes are not good and electrical discontinuities may take place.

Moreover, when the contact pads are located close to each other, it may be very difficult to ensure a good physical contact of the mechanical probes with the pads. Such problem may be emphasized when the pads are small in size and/or a large number thereof is present on each die.

In addition, even if only one probe is damaged, it may be necessary to replace the entire epoxy holder, and this negatively contributes to the increase of the overall cost of the test apparatus, and eventually of the ICs.

As an alternative to the cantilever probe cards, other known probe cards include a plurality of vertical (or pseudo-vertical) probes consisting of conductive wires passing through respective holes formed in a probe card head. In detail, the probe card head includes a top guide plate stacked on a bottom guide plate, which are suitably separated by an air gap. Each probe has a tip, which protrudes from the bottom guide plate and is adapted to electrically contact the corresponding contact pad of the die to be tested. A contact interface known as a "space transformer" (that is one of the possible contact interface types) is connected to the top guide plate and is adapted for electrically coupling the probes to the PCB (by means of corresponding wires) so that the exchange of the testing signal between the tester and the die under test may be accomplished.

A drawback of these probe cards is that they may have a poor scrubbing action on the contact pads, which may cause a reduced electric yield. In other words, the probes may not be able to adequately scrub the contact pad surface, that could have a metal oxide layer (and sometimes diffusion residuals) over the contact pad metallization region; the resulting probe scrub mark may not be able to ensure a good electrical contact between probe and pad, and if this happens the testing of the IC functionalities may be impaired.

Moreover, also in this case, when the contact pads are close to each other, it may be difficult to ensure a good physical contact of the probes with the pads. Such problem is emphasized when the pads are small in size and/or a large number thereof is present on each die.

A further drawback is that, similarly to the cantilever probe cards, when a probe breaks, it may be necessary to replace the whole probe head, thereby increasing the overall cost of the test apparatus.

Moreover, also in this case the probes are typically made based on mechanical techniques, so that the probes are different from each other. Such difference may further impair the probe card planarity.

Probe cards are also known which include MicroElectroMechanical Systems (MEMS) probes.

The probe cards having MEMS probes include of a multilayer ceramic head to which the MEMS probes are coupled. Each MEMS probe includes a base with contact features (such as a tip) adapted to contact the pad, and a beam, which is attached at on only one end thereof to the multilayer ceramic head and has the other end connected to the base.

Each MEMS probe is obtained by means of lithographic techniques, in particular a trench into a sacrificial substrate is formed (for example, by means of etching processes) and then filled with conductive material (e.g., gold) so as to obtain a base of the MEMS probe adapted for contacting the contact pad. The conductive material is then deposited on a portion of the sacrificial substrate in order to obtain the beam of the MEMS probe. Then, the MEMS probes are bonded to the multilayer ceramic head by means of wire bonds or other techniques and the sacrificial substrate is eliminated (for example, by an etching process). Finally, the multilayer ceramic head is connected to the PCB.

A drawback of MEMS probe cards is that even if only one MEMS probe is damaged, it may be necessary to replace the whole multilayer ceramic head, and this may be very expensive.

Other, different types of cantilever, vertical and MEMS probe cards are also known.

SUMMARY

An embodiment of a probe card overcomes these and other problems of known probe cards.

An embodiment of a probe card comprises a set of replaceable elementary probe card units which comprise one or more MEMS probes.

In detail, according to an embodiment of the present disclosure, a probe card is provided adapted for testing at least one integrated circuit integrated on corresponding at least one die of a semiconductor material wafer. The probe card includes a board adapted for the coupling to a tester apparatus, and a plurality of probes coupled to the said board. The probe card comprises a plurality of replaceable elementary units, each one comprising at least one of said probes for contacting the integrated circuit. The replaceable elementary units of said plurality are arranged so as to correspond to an arrangement of the at least one die on the wafer to be tested.

BRIEF DESCRIPTION OF THE DRAWINGS

These and other features and advantages of embodiments of the disclosure will be made apparent by the following detailed description of one or more embodiments, provided merely by way of non-limitative example, and such description will be conducted making reference to the attached drawings, wherein.

DETAILED DESCRIPTION

Figure 1:
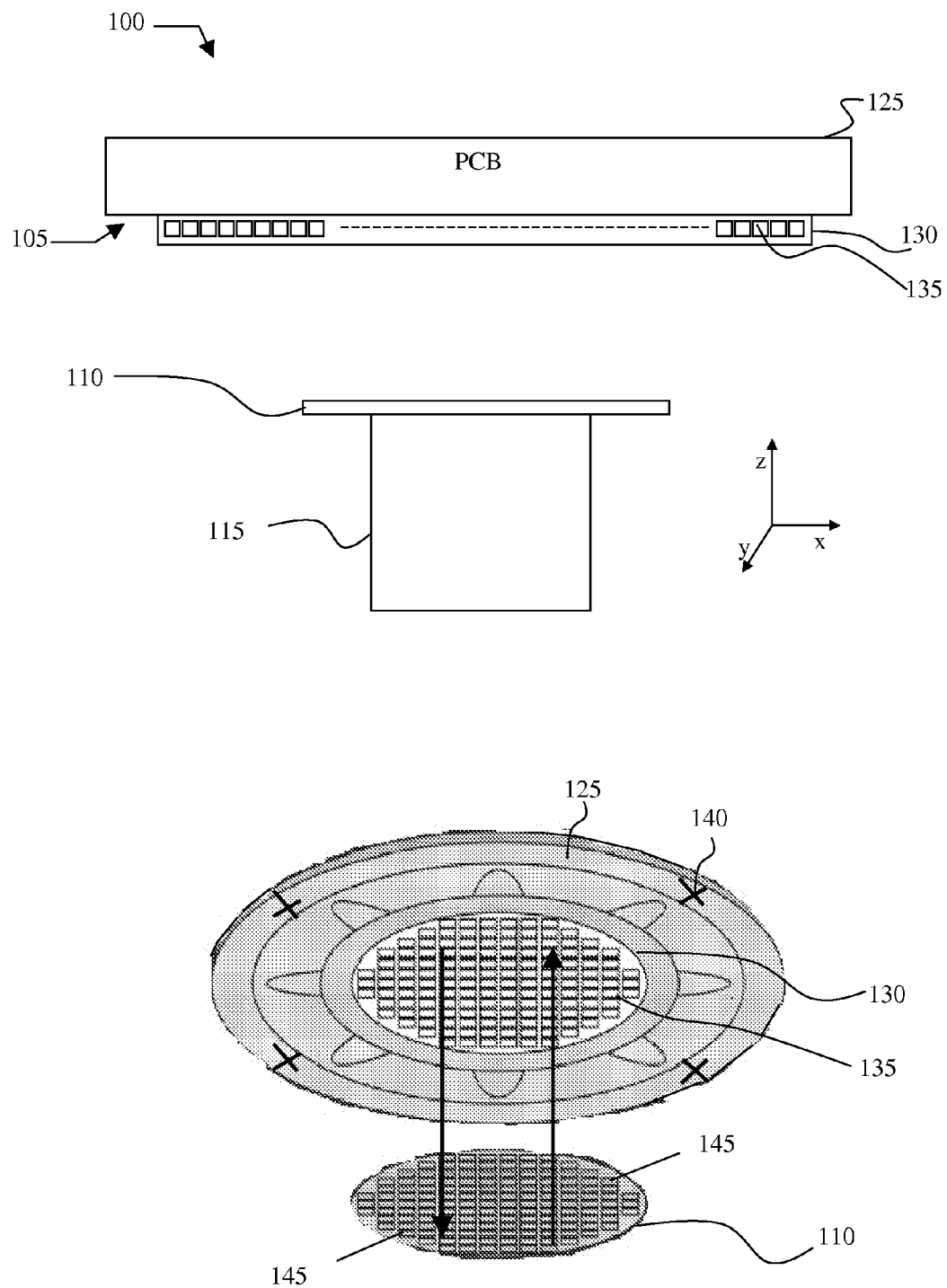
FIG. 1 schematically shows a cross-sectional view of test equipment wherein a test apparatus according to an embodiment of the present disclosure is used.

Throughout the following description, identical or similar elements in the drawings are denoted by same reference numerals.

Referring to FIG. 1, a cross-sectional view of an embodiment of test equipment 100 is schematically shown, in which an exemplary structure and the positioning of a probe card 105 according to an embodiment of the present disclosure and of a semiconductor wafer 110 to be tested is visible.

The semiconductor wafer 110 to be tested is placed on a chuck 115, which is capable of movement in the three orthogonal directions "x", "y" and "z" schematically indicated in the drawing. The chuck 115 may also be rotated and tilted, and it may be further capable of other movements, so that once the semiconductor wafer 110 is placed on the chuck 115, the latter is moved so that the dies 145 of the wafer 110 to be tested are brought close to the probe card 105, for enabling communication therewith.

In the example at issue, the probe card 105, in one of its embodiments, includes a PCB 125 forming a support board for pseudo silicon wafer 130—herein referred to as test silicon wafer—made up of a plurality of pseudo-dies 135 each one forming an elementary probe unit.

The PCB 125 comprises all the circuitry which is employed for the communication between the tester (not shown in figure) and the wafer 110 under test. For example, the PCB 125 comprises data/signal processing circuits that control the overall operation of the probe card 105, and which may operate under the control of a software stored in a storage unit (e.g., one or more memories which are also included in the PCB 125).

A top view of the probe card 105 (including the test silicon wafer 130) and the semiconductor wafer 110 is also shown in the drawing.

Fiducial signs 140 may be provided on the PCB 125, or on the test wafer 130, for allowing the correct alignment between the probe card 105 and the semiconductor wafer 110.

As shown, the elementary probe units 135 are arranged in the test silicon wafer 130 in order to form a two-dimensional arrangement which corresponds to the arrangement of dies on the semiconductor wafer 110 under test. In particular, the test silicon wafer 130 comprises an array of the elementary probe units 135 which reproduce a shape of the wafer 110 to be tested. In an embodiment of the present disclosure, each of the elementary probe units 135 of the test wafer 130 belonging to the probe card 105 is adapted to establish a one-to-one communication relationship with a corresponding die of the semiconductor wafer 110 to be tested, by means of a number of MEMS probes adapted to contact the pads of an IC.

In particular, as better described in the following, each elementary probe unit 135 is formed starting from a silicon die, individually diced and finally assembled with the other elementary probe units 135 in order to form the test silicon wafer 130 having a shape corresponding to the semiconductor wafer 110 to be tested.

Figure 2:
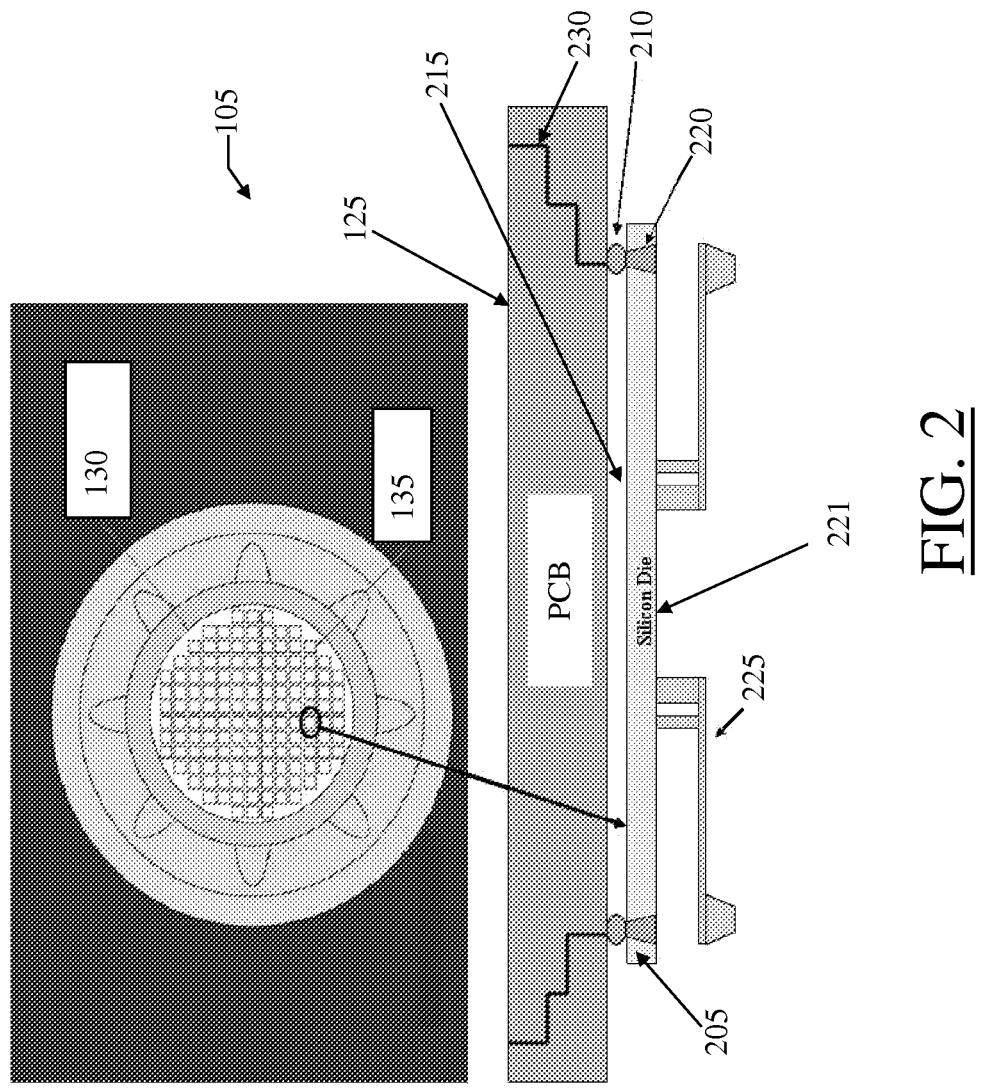
FIG. 2 schematically shows a probe card according to an embodiment of the present disclosure.

Referring to FIG. 2, a portion of the probe card 105 is shown. In particular, FIG. 2 shows an elementary probe unit 135 according to an embodiment of the present disclosure. The elementary probe unit 135 includes a silicon die 205 which is connected, e.g. by flip-chip techniques, to the PCB 125. In particular, contact bumps 210 are provided in order to connect a top surface 215 of the silicon die 205 to the PCB 125. Through Silicon Vias (TSV) 220 are provided crossing the silicon die 205 in order to connect the top surface 215 to a bottom surface 221 of the silicon die 205. A plurality (for example, two as shown in figure) of mechanical elements forming probes 225 (particularly of MEMS type), are connected to the bottom surface 221 of the silicon die 205. In particular, the TSVs 220 are adapted to electrically connect the MEMS probes 225 to the top surface 215 of the silicon die 205 and thus to the PCB 125, by means of a conductive path that may also include one or more layers of TSVs, vias, and metal strips.

In particular, for electrically contacting the input/output contact pads of the die to be tested and exchanging the test signals between the input/output contact pads and the tester (not shown in figure), the PCB 125 provides corresponding conductive paths 230, which electrically couple the tester to the silicon die 205 and thus to the probes 225. In particular, for testing the dies in order to asses the functionality of the ICs integrated therein, the tester is adapted to generate test signals to be fed to the ICs integrated on the dies belonging to the semiconductor wafer 110; the tester is coupled by means of the PCB 125 to the elementary probe units 135, each one of which is adapted to be fed by the tester trough the conductive paths 230 with the test signals, and the power supply necessary for its operation.

In other words, the MEMS probes 225, the TSVs 220, the bumps 210 and the conductive paths 230 are adapted to establish a bi-directional link between the tester and each die (or groups of dies) of the semiconductor wafer 110 under test. The probe card 105 receives the test input signals from the tester and transmits them to the dies to be tested by using the MEMS probes 225. The test signals are then used to test the IC integrated on the die belonging to the semiconductor wafer 110; test response signals are generated in response to the test input signals. The test response signals are transmitted to the probe card 105, and then sent to the tester, which processes them to assess the functionality of the IC integrated on the die under test.

Figure 3:
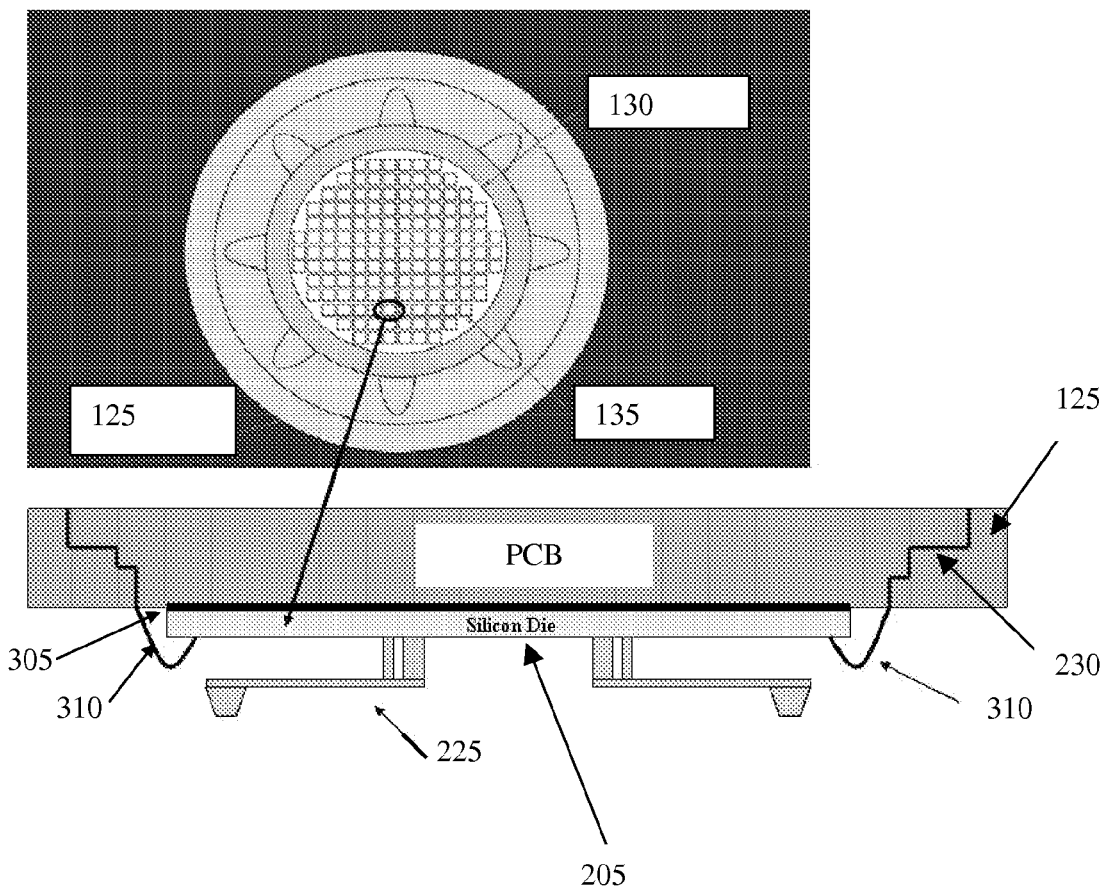
FIG. 3 schematically shows a probe card according to another embodiment of the present disclosure.

Referring to FIG. 3, an elementary probe unit 135 (also in this case coupled to the PCB 125) according to another embodiment of the present disclosure is shown.

The elementary probe unit 135 includes the silicon die 205, which is attached by means of a resin layer or sticky layer 305 to the PCB 125. Wire bonds 310 are provided for electrically connecting the silicon die 205 to the conductive paths 230 formed on the PCB.

Figure 4:
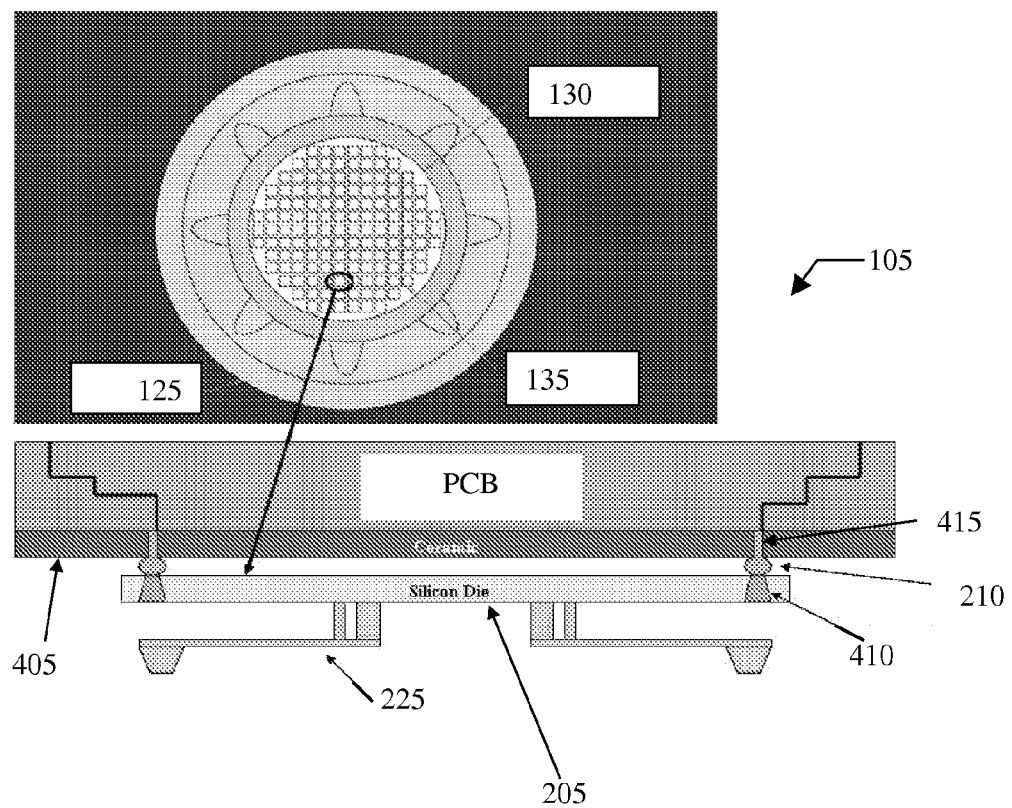
FIG. 4 schematically shows a card according to still another embodiment of the present disclosure.

Referring to FIG. 4, an elementary probe unit 135 according to a still another embodiment of the present disclosure is shown.

In this embodiment, a multilayer ceramic material 405 is interposed between the PCB 125 and the silicon die 205. The multilayer ceramic material 405 is employed for improving the performance of the probe card 105 when it is subjected to high temperatures. For example, the multilayer ceramic material 405 allows preventing the thermal expansion of the PCB 125 during the exposure of the probe card 105 to high temperature.

Through vias 410 and 415 are provided, respectively crossing the silicon die 205 and the multilayer ceramic material 405. The through vias 410 and 415 may also be replaced by a more complex conductive path scheme inside the multilayer ceramic material 415 and the silicon die 205. The bumps 210 connect the through vias 410 to corresponding through vias 415 so that a conductive path is formed between the PCB 125 and the MEMS probes 225.

Figure 5:
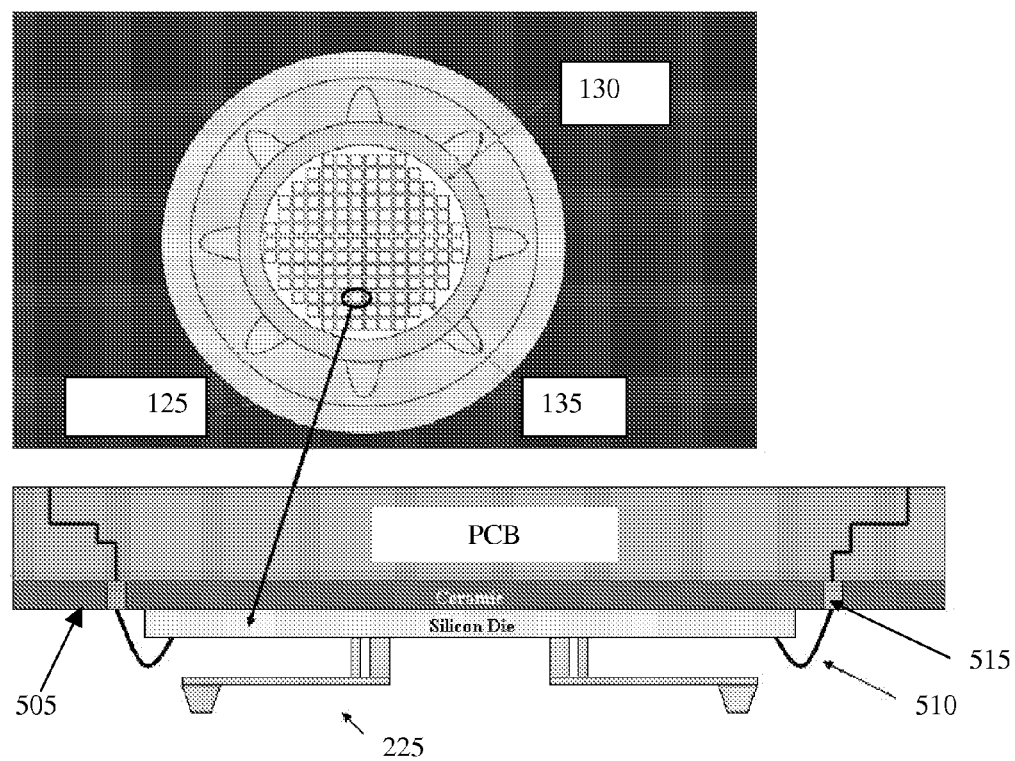
FIG. 5 schematically shows a probe card according to still another embodiment of the present disclosure.

Finally, referring to FIG. 5, an elementary probe unit 135 according to still another embodiment of the present disclosure is shown. In this case, a multilayer ceramic material 505 is interposed between the PCB 125 and the silicon die 205. Wire bonds 510 are provided for connecting the silicon die 205 to the multilayer ceramic 505. In particular, the wire bonds 510 are connected to through vias 515 crossing the multilayer ceramic 505. The through vias 515 may also be replaced by a more complex conductive path scheme inside the multilayer ceramic. In such a way, a conductive path formed by the wire bonds 510, the trough vias 515 and the paths 230 is formed so that the test signals may be exchanged between the tester and the silicon wafer to be tested by means of the probe card 105 according to an embodiment of the present disclosure.

It should be noted that, according to an embodiment of the present disclosure, the probe card 105 may be formed by connecting in different way one or more silicon dies 205. In particular, depending on the shape of the wafer to be tested, each elementary probe unit 135 may be arranged in order to form a test silicon wafer 130 having a shape similar to that of the wafer under test.

In particular, according to an embodiment of the present disclosure, the probe card 105 may be formed by a plurality of basic and replaceable elementary units (the elementary probe units 135) so as to obtain a modular and flexible structure which is easily usable for any semiconductor wafer to be tested, irrespective of the type of ICs integrated therein. In other words, depending on the semiconductor wafer to be tested, the elementary probe units 135 may be arranged in different ways and shapes. In such a way, the probe card 105 has a high flexibility, and, therefore, may be adaptable to any wafer to be tested and the overall cost of the testing of different several wafers is significantly reduced.

Moreover, such modular and flexible structure allows, in case one of the elementary probe units 135 is damaged, to replace it without changing the entire test silicon wafer 130.

Additionally, the use of a silicon die for manufacturing the elementary probe unit 135 allows further reducing the overall cost of each probe which is employed in the testing apparatus.

In other words, the test system according to the described embodiments of the present disclosure may be significantly less expensive than those using the conventional probe cards, since the elementary probe units are manufactured by lithographic techniques starting from a silicon wafer.

It is pointed out that, in some embodiments of the disclosure, the test silicon wafer 130 may include a number of elementary probe units 135 lower than the number of dies of the semiconductor wafer 110 to be tested (in which case, groups of dies of the wafer are tested in parallel), or the number of elementary probe units 135 may be even greater than the number of dies 105 of the specific wafer 110 under test (in which case, only a subset of the elementary probe units 135 are exploited for testing the whole wafer).

Moreover, an embodiment of the present disclosure allows testing at the same time the whole semiconductor wafer 110, or at least groups of dies 145 on the wafer 110. In this way, a significant reduction of the test time may be attained, with a corresponding productivity improvement.

Figure 6:
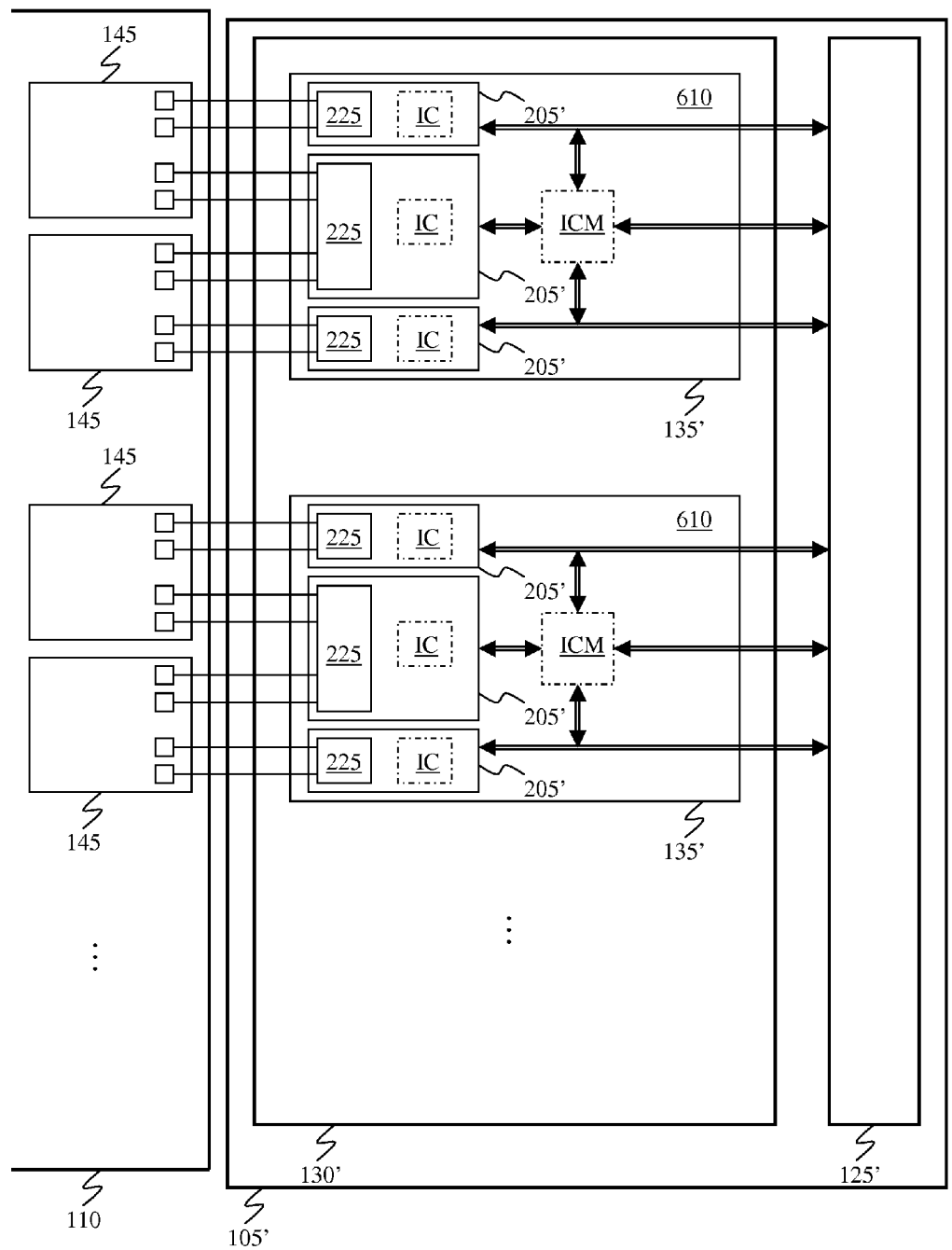
FIG. 6 is a schematic system level view of a probe card according to an embodiment of the present disclosure.

Referring to FIG. 6, a system level view of a probe card 105' according to an embodiment of the present disclosure is shown. The probe card 105' includes a test wafer 130' comprising a set of probe units 135' each including a respective set of one or more silicon dies 205' sharing a same substrate 610. Each silicon die 205' is provided with one or more probes 225' (particularly of the MEMS type) adapted to interact with pads on at least one die 145 in the semiconductor wafer 110 to be tested.

The test wafer 130' is supported by a PCB 125', which may comprise all the circuitry employed for the communication between the tester and the wafer 110 under test. In the same way as for the PCB 125 of the previous embodiments, the PCB 125' may comprise data/signal processing circuits that control the overall operation of the probe card 105', and which may operate under the control of software stored in a storage unit (e.g., one or more memories which may also be included in the PCB 125').

A main purpose of a probe unit's substrate 610 is to house the silicon dies 205' of said probe unit 135', for providing a robust mechanic support and at the same time electrically insulating each silicon die 205' from the others. Thus, the substrate 610 may be formed by a proper insulating material, such as a resin or a polymer.

Figure 7:
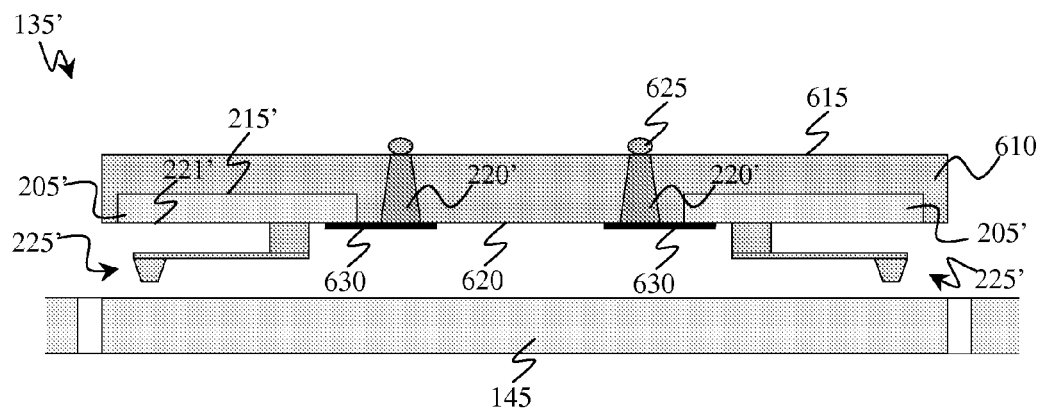
FIGS. 7-11 are cross sectional views of a portion of the probe card of FIG. 6 according to different embodiments of the present disclosure.

FIG. 7 is a cross-sectional view of a portion of the probe card 105' illustrated in FIG. 6. Particularly, FIG. 7 shows a probe unit 135' according to an exemplary embodiment of the present disclosure. The probe unit 135' includes a substrate 610 having a top surface 615 facing the PCB 125' (not illustrated in FIG. 7) and a bottom surface 620. The probe unit 135' further includes a set of silicon dies 205' (in the example at issue, two) each having a top surface 215' covered by the substrate 610 and an exposed bottom surface 221'. MEMS probes 225' are connected to the bottom surface 221' of the silicon dies 205', for electrically contacting the input/output contact pads of one or more dies 145 on the semiconductor wafer 110 to be tested. Each silicon die 205' is adapted to be electrically connected to the PCB 125'. For this purpose, the substrate 610 includes through vias 220' connecting the top surface 615 with the bottom surface 620; the through vias 220' are connected at the top surface 615 with contact bumps 625 adapted to be connected in turn to the PCB 125'. Moreover, metal lines 630 are provided on the bottom surface 620 of the substrate 610 for connecting each through vias 220' to the bottom surface 221' of a corresponding silicon die 205'. In this way, a bi-directional link between the tester and each die 145 on the semiconductor wafer can be established through the MEMS probes 225', the metal lines 630, the through vias 220' and the bumps 625.

Since, thanks to the presence of the substrate 610, a single probe unit 135' may include more than one silicon die 205', it is possible to reduce the global costs by using smaller silicon dies 205', which may be also reused for testing different devices. Moreover, this solution allows one to better exploit the area of the probe unit 135'.

According to an alternative embodiment of the present disclosure, the silicon dies 205' may be provided with silicon through vias each electrically coupled with a respective through via 220' crossing the substrate 610.

Figure 8:
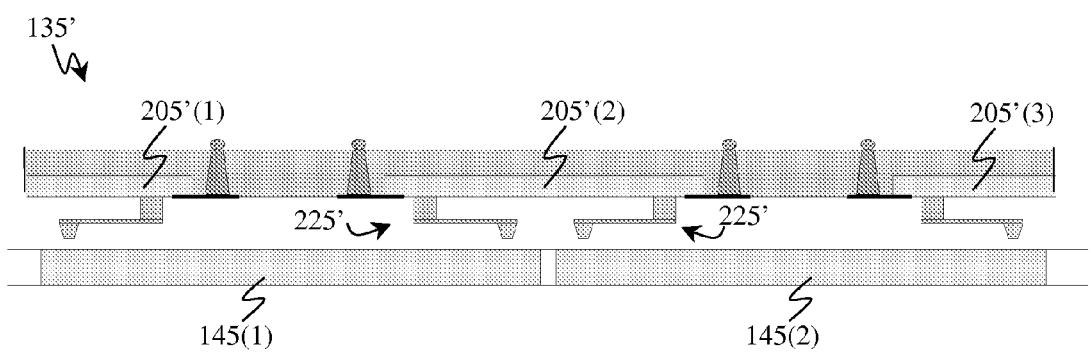

FIG. 8 is a cross-sectional view of a portion of the probe card 105' illustrated in FIG. 6, which shows a probe unit 135' according to a further exemplary embodiment of the present disclosure. Particularly, the set of silicon dies included in the probe unit 135' are adapted to electrically contact the input/output contact pads of a plurality of dies 145 on the semiconductor wafer 110 to be tested. Making reference to the example at issue, a first silicon die 205'(1) is provided with MEMS probes 225' for electrically contacting the input/output contact pads of a first die 145(1) in the semiconductor wafer 110; a second silicon die 205'(2) is provided with first MEMS probes 225' for electrically contacting the input/output contact pads of the first die 145(1) and second MEMS probes 225' for electrically contacting the input/output contact pads of a second die 145(2) in the semiconductor wafer 110; finally, a third silicon die 205'(3) is provided with MEMS probes 225' for electrically contacting the input/output contact pads of the second die 145(2). In other words, thanks to the proposed embodiment, it may be possible to implement complex structures, wherein the through vias 220' crossing the substrate 610 may be placed in the available areas between adjacent silicon dies 205', and a die 145 in the semiconductor wafer 110 may be contacted by MEMS probes 225' of more than one silicon die 205'.

Figure 9:
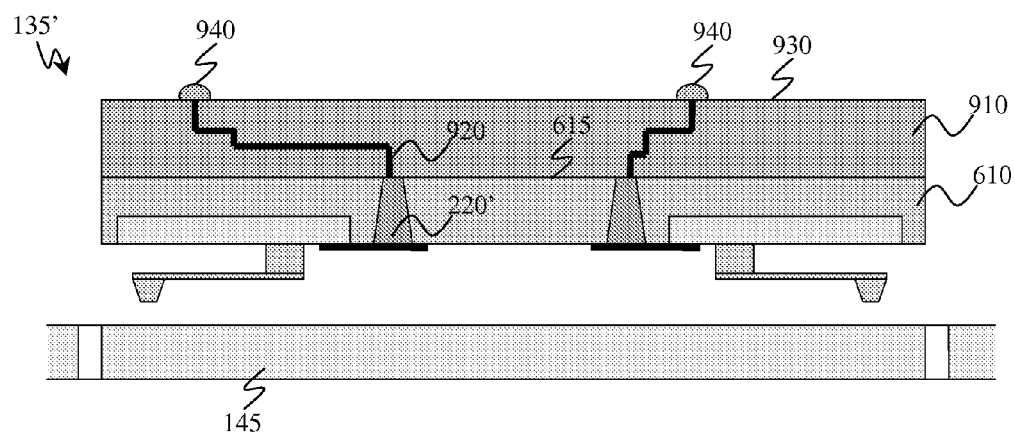

According to a further embodiment of the present disclosure, each probe unit 135' may be provided with a respective local PCB, adapted to be used for increasing the pitch between adjacent through vias 220' so as to simplify the assembly of the various probe units 135' to the probe card 105'. For example, as illustrated in FIG. 9, the top surface 615 of the substrate 610 may be directly connected to a local PCB 910 provided with a conductive path 920 per through via 220' that crosses the substrate 610. Particularly, each through via 220' is electrically connected to a respective conductive path 920 in the local PCB 910; each conductive path 920 ends on a top surface 930 of the local PCB 910 with a contact bump 940 adapted to be connected to the PCB 125. In this way, instead of directly connecting the probe unit 135' to the PCB 125' using contact bumps connected to the top ends of the trough vias 220' —and, thus, very close to each other—the probe unit 135' of FIG. 9 may be connected to the PCB 125 through more spaced contact bumps 940.

The same considerations may apply if the local PCB 910 is replaced with a ceramic layer, or with equivalent means.

According to a further embodiment of the present disclosure, the silicon dies 205' included in the probe units 135' may include integrated circuits—identified in FIG. 6 with the reference IC—adapted to be used during the test of the dies 145 on the semiconductor wafer 110. For example, said integrated circuits IC may include circuits adapted to sense/generate very low power signals or pre-process signals received from/provided to the tested dies 145 and so on.

Figure 10:
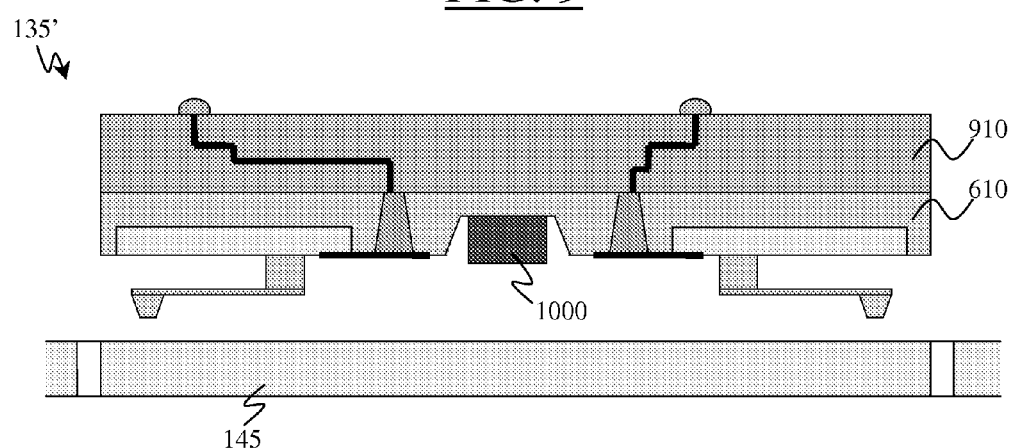

Moreover, the substrate 610 of a probe unit 135' may be advantageously exploited for housing other electronic devices useful for the operation of the probe card 105'. For example, FIG. 10 is a cross-sectional view of a portion of the probe card 105', which shows a probe unit 135' in which the substrate 610 thereof houses a supply filter capacitor 1000.

Figure 11:
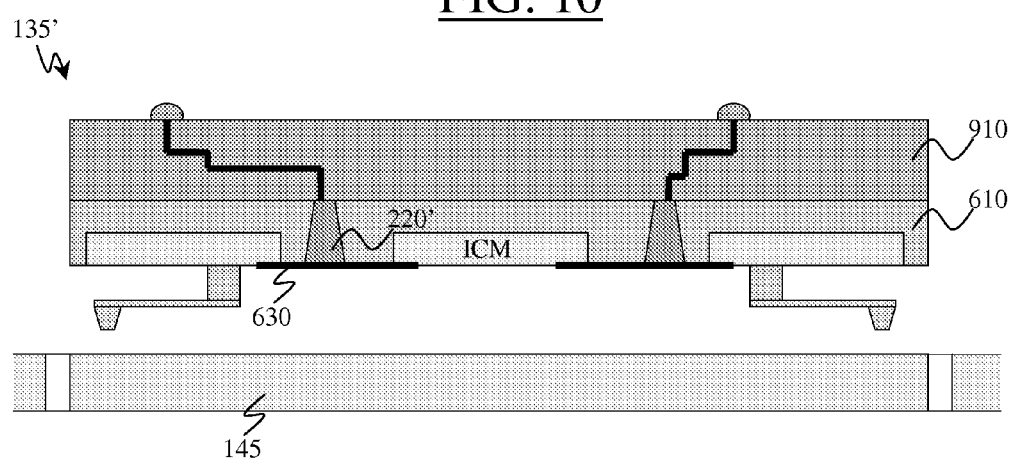

According to a further embodiment of the present disclosure, the substrate 610 of a probe unit 135' may house a dedicated control chip—identified in FIG. 6 with the reference ICM—integrating circuits adapted to manage the operations performed by the probe unit 135' and control the traffic of the signals generated by/provided to the silicon dies 205' connected to MEMS probes 225'. Moreover, the control chip ICM may be used for integrating additional circuits to be shared among the silicon dies 205' of the probe unit 135'. For example, the control chip ICM may integrate a digital to analog converter that can be shared by more than one silicon die 205' of the probe unit 135'. FIG. 11 is a cross-sectional view of a portion of the probe card 105', which shows a probe unit 135' in which the substrate 610 thereof houses a control chip ICM which is connected to the through vias 220'—and, thus, to the silicon dies 205'—by means of the metal lines 630.

Naturally, in order to satisfy local and specific requirements, a person skilled in the art may apply to the embodiments described above many modifications and alterations. Particularly, although embodiments of the present disclosure have been described, it should be understood that various omissions, substitutions and changes in the form and details as well as other embodiments are possible; moreover, it is expressly intended that specific elements and/or method steps described in connection with any disclosed embodiment of the disclosure may be incorporated in any other embodiment as a general matter of design choice.

For example, although in the preceding description reference has been made to an elementary unit having only one ceramic layer, it is possible to have a ceramic layer in common among different silicon dies.

Moreover, although in the preceding description reference has been made to elementary units equal each other, an embodiment of the present disclosure may be applied also in case the elementary units 135 are different from each other, such as manufactured with different material or having a different structure.

An embodiment according to the present disclosure may be applied in such a way that a silicon die 205 may test only a portion of a die 145 of the semiconductor wafer 110.

The conductive path routing may be accomplished partly in the test dies 135 and/or partly in the multilayer ceramic material and/or partly in the PCB using for example one or more layers of TSVs, through vias and metal strips.

Moreover different techniques may be used to assemble the silicon die 135 on the multilayer ceramic and/or on the PCB.

Also, different techniques may be used to assemble the multilayer ceramic on the PCB.

From the foregoing it will be appreciated that, although specific embodiments have been described herein for purposes of illustration, various modifications may be made without deviating from the spirit and scope of the disclosure.

What is claimed is:

1. A probe card, comprising:
   a board adapted to enable coupling an integrated circuit to a tester apparatus; and
   a plurality of probes coupled to the said board; and
   a plurality of replaceable elementary units, each replaceable elementary unit including at least one of said plurality of probes and configured to contact an externally accessible terminal of the integrated circuit, the plurality of replaceable elementary units being arranged so as to correspond to an arrangement of at least two dies on a wafer of integrated circuit dies, the at least two dies having a different configuration of externally accessible terminals.

2. The probe card according to claim 1, wherein each one of the plurality of replaceable elementary units is adapted to be put in a one-to-one relationship with a corresponding die.

3. The probe card according to claim 1, wherein each one of the plurality of replaceable elementary units is in use adapted to be put in a one to at least two relationships with at least two dies of the semiconductor wafer.

4. The probe card according to claim 1, wherein at least two of said replaceable elementary units are arranged so as to correspond to one die of the wafer to be tested.

5. The probe card according to claim 1, wherein each replaceable elementary unit comprises at least one further semiconductor material die being adapted for coupling the at least one probe to a printed circuit board, conductive paths being provided in the printed circuit board.

6. The probe card according to claim 5, wherein the at least one further semiconductor material die includes an integrated circuit adapted to be used during the testing of the at least one integrated circuit integrated on the corresponding at least one die.

7. The probe card according to claim 5, wherein the at least one probe comprises a Micro Electro Mechanical Systems probe.

8. The probe card according to claim 5, wherein the at least one further semiconductor material die is electrically coupled to the board by means of a conductive path comprising at least one through via crossing the further semiconductor material die and by means of flip chip technique.

9. The probe card according to claim 5, wherein the at least one further semiconductor material die is coupled to the board by means of a resin layer or sticky layer and the at least one probe is coupled to the corresponding conductive path by means of a corresponding wire bond.

10. The probe card according to claim 8, further comprising at least one ceramic material layer, said ceramic material layer being arranged between the at least one further semiconductor material die and the board, said conductive path comprising at least one further through via crossing the ceramic material layer and being adapted for coupling the probe to the corresponding conductive path.

11. The probe card according to claim 9, further comprising at least one ceramic material layer, said ceramic material layer being arranged between the at least one further semiconductor material die and the board, said conductive path comprising at least one further trough via crossing the ceramic material layer and at least one wire bond being adapted for coupling the at least one further semiconductor material die to the corresponding further through via.

12. The probe card according to claim 5, wherein the at least one further semiconductor material die is housed in a substrate and is electrically coupled to the board by means of a conductive path comprising at least one through via crossing the substrate.

13. The probe card according to claim 12, wherein the substrate is adapted to house at least one control chip integrating at least one circuit adapted to be used during the testing of the at least one integrated circuit integrated on the corresponding at least one die.

14. The probe card according to claim 12, wherein the at least one further semiconductor material die includes a plurality of further semiconductor material dies, each one being electrically couples to the board by means of a respective conductive patch comprising at least one respective through via crossing the substrate.

15. A method for testing an integrated circuit integrated on at least corresponding at least one die of a semiconductor material wafer, the method comprising the steps of:
providing a probe card including a board adapted for the coupling to a tester apparatus,
providing a plurality of probes being coupled to the said board,
providing a plurality of replaceable elementary units, each replaceable elementary unit comprising at least one probe for contacting the integrated circuit,
arranging the plurality of replaceable elementary units in correspondence of the at least one semiconductor material die on the wafer,
contacting the integrated circuit with a respective probe,
at the test apparatus, generating at least one first test signal,
providing said at least one first test signal to the integrated circuit through the respective probe, and
providing to the test apparatus at least one second test signal generated by the integrated circuit according to the received at least one first test signal.

16. A probe apparatus, comprising:
a support platform including a first test-signal node and a second test-signal node;
a first probe-tip unit removably attached to the support platform and including a first probe tip having a first configuration coupled to the first test-signal node; and
a second probe-tip unit removably attached to the support platform and including a second probe tip having a second configuration coupled to the second test-signal node.

17. The probe apparatus of claim 16 wherein:
the first probe-tip unit includes a third probe tip coupled to the second test-signal node.

18. The probe apparatus of claim 16 wherein the support platform comprises a printed circuit board.

19. The probe apparatus of claim 16 wherein the support platform comprises a substrate formed from an electrical insulator.

20. The probe apparatus of claim 16 wherein the first probe-tip unit comprises an integrated-circuit die.

21. The probe apparatus of claim 16 wherein:
the support platform includes a first surface on which the test-signal node is disposed and includes a second surface; and
the first probe-tip unit includes a first surface that faces the second surface of the support platform and includes a second surface from which the first probe tip extends.

22. The probe apparatus of claim 16 wherein:
the support platform includes a surface; and
the first probe-tip unit includes a surface that is attached to the surface of the support platform.

23. The probe apparatus of claim 16, further comprising:
wherein the support platform includes a surface;
wherein the probe-tip unit includes a surface that faces the surface of the support platform; and
a standoff disposed between the surfaces of the support platform and the probe-tip unit and attaching the probe-tip unit to the support platform.

24. The probe apparatus of claim 16, further comprising an electrical insulator layer disposed between the support platform and the probe-tip unit.

25. The probe apparatus of claim 16 wherein:
the support platform includes a first surface on which the test-signal node is disposed, a second surface on which a first coupling node is disposed, and a first conductor that couples the test-signal and coupling nodes; and
the probe-tip unit includes a first surface that faces the second surface of the support platform and on which is disposed a second coupling node that is coupled to the first coupling node, a second surface from which the probe tip extends, and a second conductor that couples the second coupling node and the probe tip.

26. The probe apparatus of claim 16, further comprising:
wherein the support platform includes a first surface on which the test-signal node is disposed, a second surface on which a first coupling node is disposed, and a first conductor that couples the test-signal and coupling nodes;
wherein the probe-tip unit includes a first surface that faces the second surface of the support platform and on which is disposed a second coupling node, a second surface from which the probe tip extends, and a second conductor that couples the second coupling node and the probe tip; and
a conductive standoff disposed between the support platform and the probe-tip unit and coupling the first and second coupling nodes.

27. The probe apparatus of claim 16, further comprising:
wherein the support platform includes a first surface on which the test-signal node is disposed, a second surface on which a first coupling node is disposed, and a first conductor that couples the test-signal and coupling nodes;
wherein the probe-tip unit includes a first surface that faces the second surface of the support platform, a second surface from which the probe tip extends and on which is disposed a second coupling node, and a second conductor that couples the second coupling node and the probe tip; and
a third conductor that couples the first and second coupling nodes.

28. The probe apparatus of claim 16, further comprising:
wherein the support platform includes a first surface on which the test-signal node is disposed, a second surface on which a first coupling node is disposed, and a first conductor that couples the test-signal and coupling nodes;

a layer including a first surface attached to the second surface of the support platform, a second surface, a second coupling node disposed on the first surface and coupled to the first coupling node, a third coupling node disposed on the second surface, and a second conductor that couples the second and third coupling nodes;

wherein the probe-tip unit includes a first surface that faces the second surface of the support platform and on which is disposed a fourth coupling node, a second surface from which the probe tip extends, and a third conductor that couples the fourth coupling node and the probe tip; and a conductive standoff disposed between the layer and the probe-tip unit and coupling the third and fourth coupling nodes.

29. The probe apparatus of claim 16, further comprising:

wherein the support platform includes a first surface on which the test-signal node is disposed, a second surface on which a first coupling node is disposed, and a first conductor that couples the test-signal and first coupling nodes;

a layer including a first surface attached to the second surface of the support platform, a second surface, a second coupling node disposed on the first surface and coupled to the first coupling node, a third coupling node disposed on the second surface, and a second conductor that couples the second and third coupling nodes;

wherein the probe-tip unit includes a first surface that faces the second surface of the support platform, a second surface from which the probe tip extends and on which is disposed a fourth coupling node, and a third conductor that couples the fourth coupling node and the probe tip; and a fourth conductor that couples the third and fourth coupling nodes.

30. The probe apparatus of claim 16, further comprising:

wherein the support platform includes a first surface on which the test-signal node is disposed, a second surface on which a first coupling node is disposed, and a first conductor that couples the test-signal and coupling nodes;

wherein the probe-tip unit includes a first surface that faces the second surface of the support platform, a second surface from which the probe tip extends and on which is disposed a second coupling node, and a second conductor that couples the second coupling node and the probe tip;

an integrated circuit having a third coupling node; and a third conductor that couples the first, second, and third coupling nodes.

31. The probe apparatus of claim 16, further comprising:

wherein the support platform includes a first surface on which a first intermediate node disposed, a second surface on which a first coupling node is disposed, and a first conductor that couples the first intermediate and coupling nodes;

wherein the probe-tip unit includes a first surface that faces the second surface of the support platform, a second surface from which the probe tip extends and on which is disposed a second coupling node, and a second conductor that couples the second coupling node and the probe tip;

another support platform including a first surface on which the test-signal node is disposed, a second surface on which a third coupling node is disposed, the third coupling node coupled to the first intermediate node, and a third conductor that couples the test-signal node to the third coupling node; and a fourth conductor that couples the first and second coupling nodes.

32. The probe apparatus of claim 31 wherein:

the support platform comprises an electrical insulator; and the other support platform comprises a printed circuit board.

33. The probe apparatus of claim 16 wherein:

the first probe-tip unit includes a third probe tip coupled to the second test-signal node; and the first and third probe tips are configured to communicate with a same die under test.

34. The probe apparatus of claim 16 wherein:

the probe-tip unit includes a third probe tip coupled to the second test-signal node; and the first and third probe tips are configured to communicate with respective dies under test.

35. A testing system, comprising:

a tester having a test-signal terminal; and a probe apparatus coupled to the tester, the probe apparatus including
a support platform including a test-signal node coupled to the test-signal terminal, and
a plurality of differently configured probe-tip units removably attached to the support platform and including a probe tip coupled to the first test-signal node.

36. The testing system of claim 35, further comprising a cable coupling the test-signal terminal to the test-signal node.

37. A method, comprising:

attaching a first probe-tip unit having a first probe tip in a first configuration to a support platform that includes first and second test-signal nodes such that the first probe tip is coupled to the first test-signal node; and attaching a second probe-tip unit having a second probe tip in a second configuration to the support platform such that the second probe tip is coupled to the second test-signal node.

38. The method of claim 37 wherein:

the first probe-tip unit has a third probe tip;

the support platform includes a third test-signal node; and wherein attaching the first probe-tip unit to the support platform comprises attaching the first probe-tip unit to the support platform such that the third probe tip is coupled to the third test-signal node.

39. The method of claim 37 wherein attaching the second probe-tip unit to the support platform comprises attaching the second probe-tip unit such that the second probe-tip unit is separate from the first probe-tip unit.

* * * * *